United States Patent
Wang et al.

(10) Patent No.: US 9,814,097 B2
(45) Date of Patent: Nov. 7, 2017

(54) BAKING APPARATUS FOR PRIMING SUBSTRATE

(71) Applicant: TAIWAN SEMICONDUCTOR MANUFACTURING CO., LTD., Hsinchu (TW)

(72) Inventors: Chien-Hung Wang, Toufen Township (TW); Ren-Jyh Leu, Hsinchu (TW); Shang-Wern Chang, Zhubei (TW); Heng-Hsin Liu, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 551 days.

(21) Appl. No.: 14/252,578

(22) Filed: Apr. 14, 2014

(65) Prior Publication Data
US 2015/0296563 A1   Oct. 15, 2015

(51) Int. Cl.
H05B 3/06 (2006.01)
H05B 1/02 (2006.01)
H01L 21/67 (2006.01)
H01L 21/687 (2006.01)

(52) U.S. Cl.
CPC ..... H05B 1/0233 (2013.01); H01L 21/67103 (2013.01); H01L 21/67109 (2013.01); H01L 21/6875 (2013.01)

(58) Field of Classification Search
CPC ..... H05B 1/0233; H05B 3/68; H01L 21/6875; H01L 21/67109; H01L 21/67103
USPC ............ 118/641, 712, 725; 219/121.58, 438, 219/444.1, 448.18; 438/653, 655, 706
See application file for complete search history.

(56) References Cited

U.S. PATENT DOCUMENTS

| | | | | |
|---|---|---|---|---|
| 6,461,155 B1 * | 10/2002 | Settles | ................ | B01J 3/008 118/725 |
| 2004/0042152 A1 * | 3/2004 | Ishizaka | ............ | H01L 21/67126 361/234 |
| 2009/0179366 A1 * | 7/2009 | Herchen | ........... | H01L 21/67126 269/21 |
| 2011/0124192 A1 * | 5/2011 | Ganguli | .................. | C23C 16/18 438/653 |
| 2011/0214694 A1 * | 9/2011 | Toshima | .................... | B08B 5/00 134/21 |
| 2013/0256267 A1 * | 10/2013 | Ota | .......................... | B44C 1/227 216/62 |
| 2014/0251214 A1 * | 9/2014 | Cuvalci | .................... | G01K 3/10 118/712 |
| 2015/0086301 A1 * | 3/2015 | Rogers | ................ | H01L 21/6838 414/217 |

FOREIGN PATENT DOCUMENTS

GB    2502303 A   * 11/2013   ......... H01L 21/6838

* cited by examiner

Primary Examiner — Thien S Tran
(74) Attorney, Agent, or Firm — Maschoff Brennan

(57) ABSTRACT

A baking apparatus for priming a substrate is provided, which includes a chamber, a hot plate and a barrier element. The hot plate is in the chamber and configured to bake the substrate on the hot plate. The barrier element is in contact with a periphery of the substrate and the hot plate to prevent contamination on a lower surface of the substrate. Another baking apparatus for priming a substrate is also provided, which includes a chamber and a hot plate. The hot plate is in the chamber and in full contact with a lower surface of the substrate to prevent contamination thereon.

15 Claims, 4 Drawing Sheets

BAKING APPARATUS FOR PRIMING SUBSTRATE

BACKGROUND

In the manufacture of semiconductor devices, photolithography is used to transfer the image of a pattern like a circuit pattern to a substrate in a wafer. Typically, a photolithography process entails a coating process of coating the substrate with photoresist, an exposure process of aligning the substrate with a mask bearing the pattern and directing light such as ultraviolet light through or reflected by the mask and onto the layer of photoresist, and a developing process of developing the exposed layer of photoresist to remove select (exposed or non-exposed) portions of the photoresist, thereby patterning the layer of photoresist.

The photolithography process may additionally include a primer (e.g., hexamethyldisilazane (HMDS)) coating process and one or more baking processes. The primer coating process is performed to improve the adhesion of the photoresist to the substrate. A baking process may be performed to remove moisture or an organic solvent from the substrate before the substrate is coated with the photoresist. Also, a baking process may be performed after the substrate has been coated with the photoresist to remove solvent from the photoresist.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
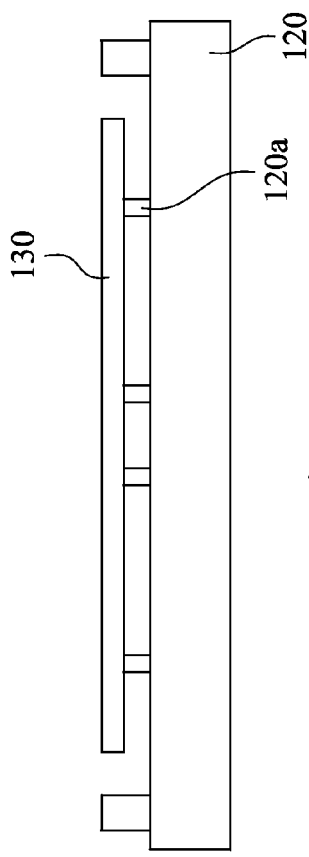
FIG. 1 is a cross-sectional view of a general baking apparatus for priming a substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As mentioned, a photolithography process may include photoresist coating, exposing and developing processes. In the photoresist coating process, a photoresist material is dispensed onto a substrate, and the substrate is rotated at a high speed so that the substrate is covered with a photoresist layer to a desired thickness. In the exposure process, a corresponding mask is aligned with the substrate covered with the photoresist layer. The photoresist layer is then irradiated with light, such as ultraviolet light, through the mask so as to transfer a pattern of the mask to the photoresist layer. In the developing process, the exposed photoresist layer is developed to form a desired photoresist pattern. The photolithography process may further include a primer (e.g., hexamethyldisilazane (HMDS)) coating process before the photoresist coating process to increase adhesion between the substrate and the photoresist layer. The photolithography process may additionally include a baking process after the photoresist coating process to harden the photoresist material.

However, during the exposure process is performed, defocus may occur, and defect may be formed in the photoresist pattern during the development process, which may impact substrate yield (or called as wafer yield) and tool available time. Accordingly, defocus during the exposure process is an important issue to be solved.

It is found that, according to the present disclosure, defocus usually occurs at an edge of the substrate since particles are adhered on an edge of backside of the substrate. The particles may be formed during the primer (e.g., hexamethyldisilazane (HMDS)) coating process or photoresist coating process before the exposure process. In order to confirm the particle source, samples with various conditions were prepared, which respectively were an untreated substrate (named as Example 1), a substrate after the photoresist material is coated (named as Example 2), a substrate after the primer is coated (named as Example 3) and a substrate after the primer and photoresist are sequentially coated (named as Example 4). Amount of particles of Examples 1-4 were detected, and Examples 1-4 respectively had 32, 57, 253 and 331 particles. The primer coating process is the main particle source accordingly. The primer coating process and the related apparatus will be described below.

FIG. 1 is a cross-sectional view of a general baking apparatus 10 for performing the primer coating process. The baking apparatus 10 includes a chamber (not shown) and a hot plate 120 disposed therein. A substrate 130 is disposed on the hot plate 120 and supported by gap pins 120a. A hydrophobic material, such as HMDS, is introduced into the chamber and then coated on an upper surface of the substrate 130 to increase adhesion between the substrate 130 and the photoresist layer. However, HMDS may be coated on not only the upper surface of the substrate 130 but also a lower surface thereof. HMDS or particles on the lower surface of the substrate 130 may cause defocus during the exposure process.

In view of the above, to address the issue, in accordance to various embodiments of the present disclosure, it is provided a baking apparatus for priming a substrate, which includes a chamber, a hot plate and a barrier element, in which the barrier element is configured to prevent contamination on a lower surface of the substrate during the primer coating process. Therefore, defocus during the exposure process would not occur. The term "contamination" refers to particles formed during the primer coating process. Various embodiments will be described in detail below.

Figure 2:
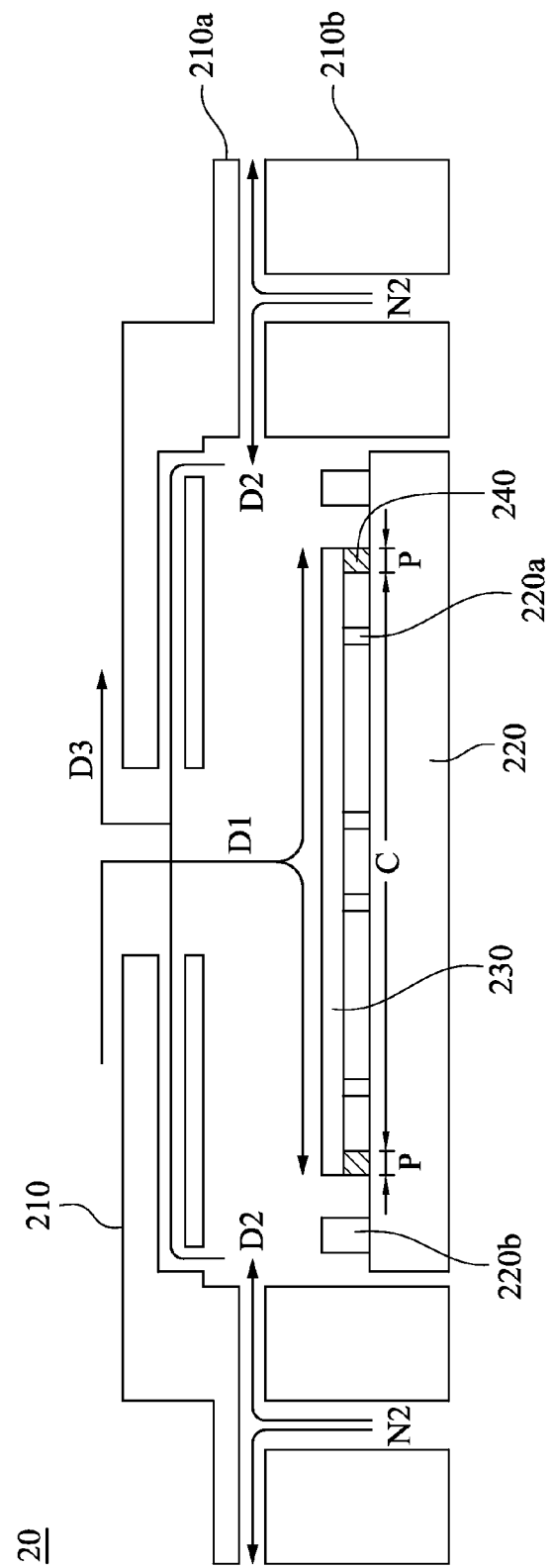
FIG. 2 is a cross-sectional view of a baking apparatus for priming a substrate in accordance with some embodiments.

FIGS. 2-5 show that the barrier element 240 is in a form of ring. FIG. 2 is a cross-sectional view of a baking apparatus 20 for priming a substrate 230 in accordance with some embodiments. The baking apparatus 20 includes a chamber 210, a hot plate 220 and a barrier element 240. In some embodiments, the baking apparatus 20 is configured to form a hydrophobic material on an upper surface of the substrate 230. In some embodiments, the hydrophobic material is HMDS.

The chamber 210 has an upper part 210a and a lower part 210b. The hot plate 220 is disposed in the chamber 210 and configured to bake the substrate 230. The hot plate 220 includes a plurality of gap pins 220a configured to support the substrate 230 and a wafer guide 220b configured to guide the substrate 230 onto the hot plate 220. The substrate 230 is disposed on the hot plate 220 and supported by gap pins 220a. A hydrophobic material, such as HMDS, may be introduced into the chamber 210 along a direction D1, and a primer is then formed on the upper surface of the substrate 230. Nitrogen may be also introduced into the chamber 210 along a direction D2 and acted as a gas wall to prevent leakage of HMDS. Mixture composed of HMDS, nitrogen and other products may be exhausted along a direction D3 to outside. However, the above design of the chamber 210 of FIG. 2, such as the upper part 210, the lower part and paths of the gases and the mixture, is just an embodiment and not limited thereto.

The barrier element 240 is in contact with a periphery of the substrate 230 and the hot plate 220 to prevent contamination on a lower surface of the substrate 230 during the primer coating process. The term "periphery" of the substrate 230 refers to an edge of the substrate 230.

Specifically, the lower surface of the substrate 230 has a central portion C and a peripheral portion P surrounding the central portion C. The term "central portion C" refers to the portion of the lower surface of the substrate 230 to be in contact with a scanner chuck during the exposure process. The "peripheral portion P" refers to the portion of the lower surface of the substrate 230 not to be in contact with the scanner chuck during the exposure process. Thus, contamination on the peripheral portion P of the lower surface of the substrate 230 does not affect focusing during the exposure process. The barrier element 240 may be disposed at various appropriate positions between the substrate 230 and the hot plate 220 to prevent contamination adhering on the central portion C of the lower surface of the substrate 230. Various configuration locations of the barrier element 240 may be shown in FIGS. 2-5 but not limited thereto. In the embodiment of FIG. 2, the barrier element 240 is in a form of ring and in contact with the hot plate 220 and the peripheral portion P of the lower surface of the substrate 230 to prevent contamination on the whole lower surface of the substrate 230.

The barrier element 240 should have excellent sealability to avoid contamination entering the space between the substrate 230 and the hot plate 220. Therefore, in various embodiments, the barrier element 240 is made of nitrile rubber, fluoroelastomer, silicone rubber or a combination thereof.

Figure 3:
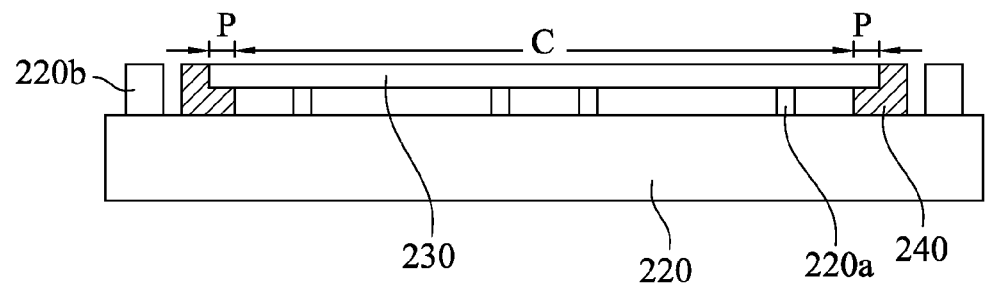
FIG. 3 is a cross-sectional view of a baking apparatus for priming a substrate in accordance with some embodiments.

FIG. 3 is a cross-sectional view of a baking apparatus 30 for priming a substrate 230 in accordance with some embodiments. As shown in FIG. 3, the barrier element 240 is in a form of ring and in contact with the hot plate 220, the peripheral portion P of the lower surface and the side surface of the substrate 230 to prevent contamination on the whole lower surface of the substrate 230.

Figure 4:
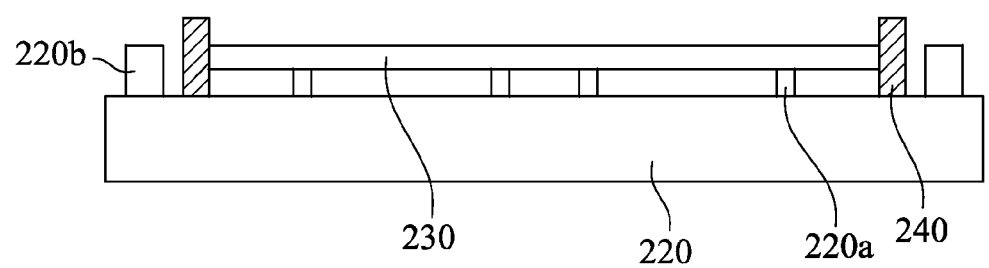
FIG. 4 is a cross-sectional view of a baking apparatus for priming a substrate in accordance with some embodiments.

FIG. 4 is a cross-sectional view of a baking apparatus 40 for priming a substrate 230 in accordance with some embodiments. As shown in FIG. 4, the barrier element 240 is in a form of ring and in contact with the hot plate 220 and the side surface of the substrate 230 to prevent contamination on the whole lower surface of the substrate 230.

Figure 5:
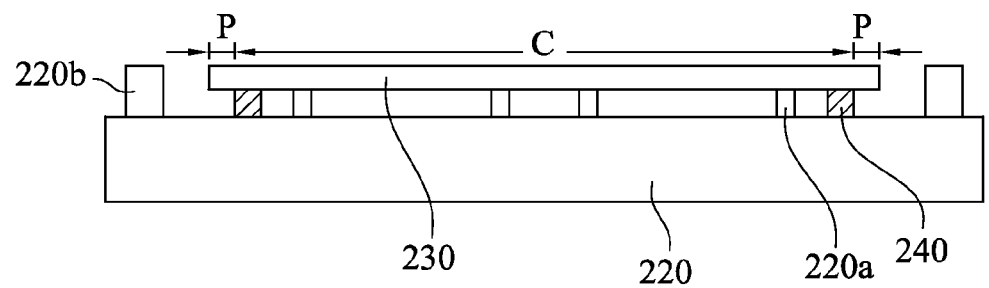
FIG. 5 is a cross-sectional view of a baking apparatus for priming a substrate in accordance with some embodiments.

FIG. 5 is a cross-sectional view of a baking apparatus 50 for priming a substrate 230 in accordance with some embodiments. As shown in FIG. 5, the barrier element 240 is in a form of ring and in contact with the hot plate 220 and a portion of the central portion C of the lower surface of the substrate 230, in which the portion of the central portion C is adjacent to the peripheral portion P. Since contamination on the peripheral portion P of the lower surface does not affect focusing during the exposure process, the barrier element 240 may be in contact with the hot plate 220 and the portion of the central portion C of the lower surface of the substrate 230 to prevent contamination on the central portion C of the lower surface of the substrate 230.

In summary, the barrier element 240 may be in contact with the peripheral portion P of the lower surface of the substrate 230 (e.g., the embodiments of FIGS. 2 and 3), the side surface of the substrate 230 (e.g., the embodiments of FIGS. 3 and 4), and the portion of the central portion C of the lower surface of the substrate 230, which is adjacent to the peripheral portion P (e.g., the embodiment of FIG. 5). Therefore, the term "periphery" of the substrate 230 herein may be defined as the peripheral portion P of the lower surface of the substrate 230, the side surface of the substrate 230, and the portion of the central portion C of the lower surface of the substrate 230, which is adjacent to the peripheral portion P.

Figure 6A:
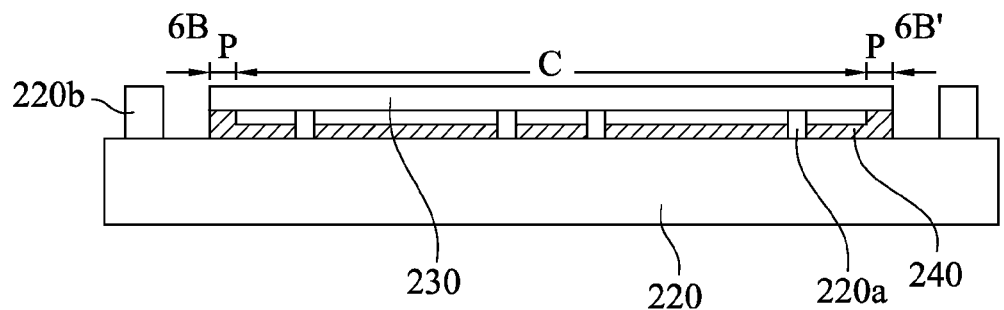
FIG. 6A is a cross-sectional view of a baking apparatus for priming a substrate in accordance with some embodiments.
Figure 6B:
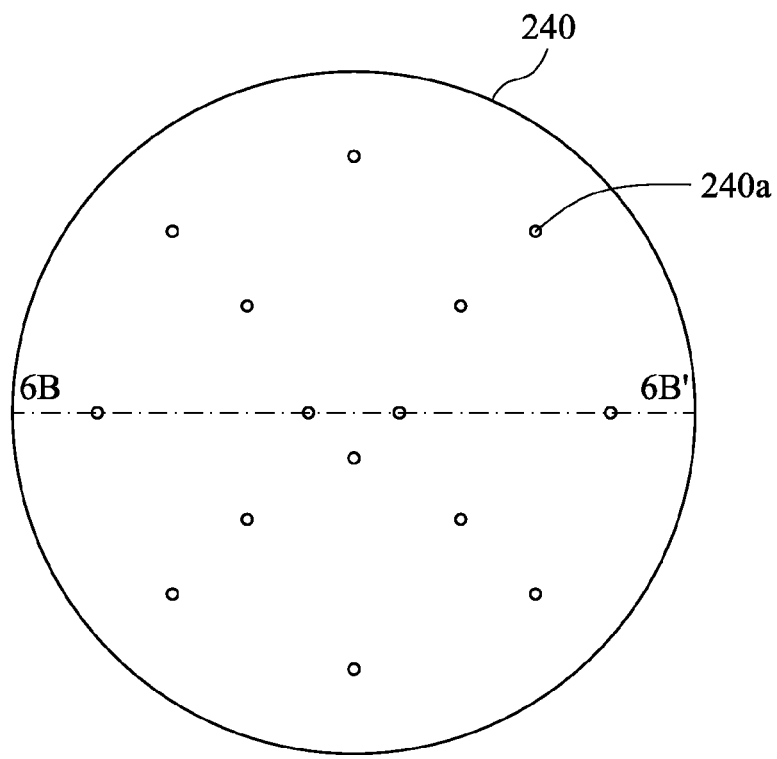
FIG. 6B is a top view of a barrier element in accordance with some embodiments.
Figure 7:
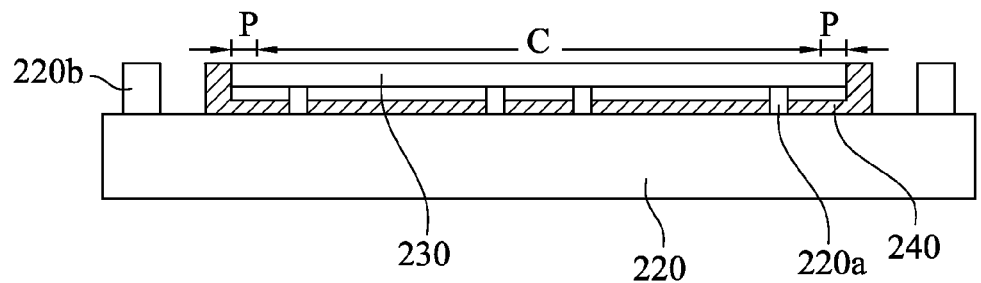
FIG. 7 is a cross-sectional view of a baking apparatus for priming a substrate in accordance with some embodiments.
Figure 8:
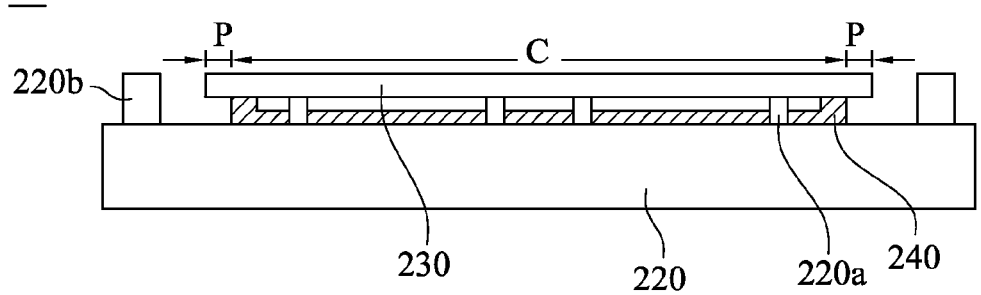
FIG. 8 is a cross-sectional view of a baking apparatus for priming a substrate in accordance with some embodiments.

FIGS. 6A, 7 and 8 show that the barrier element 240 is in a form of plate. FIG. 6A is a cross-sectional view of a baking apparatus 60 for priming a substrate 230 in accordance with some embodiments. As shown in FIG. 6A, the barrier element 240 is in a form of plate and in contact with the hot plate 220 and the peripheral portion P of the lower surface of the substrate 230 to prevent contamination on the whole lower surface of the substrate 230. In other embodiments, the barrier element is further in contact with the central portion C of the lower surface of the substrate 230. FIG. 6B is a top view of a barrier element 240 in accordance with some embodiments. As shown in FIG. 6B, the barrier element 240 includes a plurality of holes 240a, and the gap pins 220a of FIG. 6A are respectively inserted in the holes 240a.

The barrier element 240 should have excellent heat resistance to prevent thermal deformation during the baking process. Thus, in some embodiments, the barrier element 240 is made of polyimide or silicone.

FIG. 7 is a cross-sectional view of a baking apparatus 70 for priming a substrate 230 in accordance with some embodiments. As shown in FIG. 7, the barrier element 240 is in a form of plate and in contact with the hot plate 220 and a side surface of the substrate 230 to prevent contamination on the whole lower surface of the substrate 230.

FIG. 8 is a cross-sectional view of a baking apparatus 80 for priming a substrate 230 in accordance with some embodiments. As shown in FIG. 8, the barrier element 240 is in a form of plate and in contact with the hot plate 220 and a portion of the central portion C of the lower surface of the substrate 230, which is adjacent to the peripheral portion P, so as to prevent contamination on the central portion C of the lower surface of the substrate 230.

Figure 9:
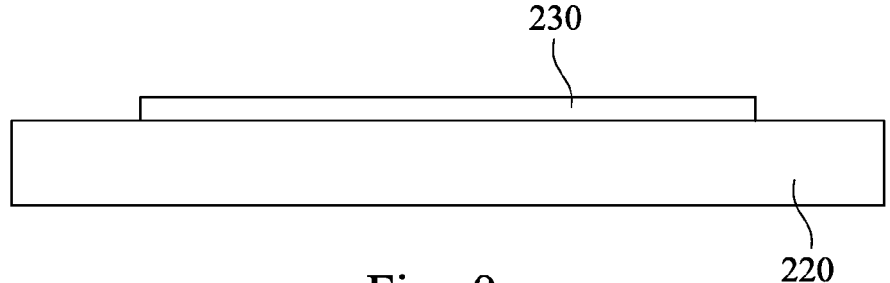
FIG. 9 is a cross-sectional view of a baking apparatus for priming a substrate in accordance with some embodiments.

Another aspect of the present disclosure provides a baking apparatus for priming a substrate, which includes a chamber and a hot plate. FIG. 9 is a cross-sectional view of a baking apparatus 90 for priming a substrate 230 in accordance with some embodiments. The baking apparatus 90 includes a chamber (e.g., the chamber 210 of FIG. 2) and a hot plate 220. The hot plate 220 is in full contact with the lower surface of the substrate 230 to prevent contamination on the whole lower surface of the substrate 230. That is, the lower surface of the substrate 230 is fully attached to an upper surface of the hot plate 220. Since the substrate 230 can be fully attached to the upper surface of the hot plate 220, there is no need for the barrier element. In some embodiments, the hot plate 220 is an electrostatic chuck type hot plate.

In view of the above, the embodiments including the barrier element or the embodiments that the substrate is in contact with the hot plate are used to prevent contamination on the lower surface of the substrate, such that defocus during the exposure process may be significantly reduced or completely avoided, and thus not to impact substrate yield and tool available time.

According to some embodiments, a baking apparatus for priming a substrate is provided, which includes a chamber, a hot plate and a barrier element. The hot plate is in the chamber and configured to bake the substrate on the hot plate. The barrier element is in contact with a periphery of the substrate and the hot plate to prevent contamination on a lower surface of the substrate.

According to some embodiments, a baking apparatus for priming a substrate is provided, in which the substrate has a lower surface having a central portion and a peripheral portion surrounding the central portion. The baking apparatus includes a chamber, a hot plate and a barrier element. The hot plate is in the chamber and configured to bake the substrate on the hot plate. The barrier element is between the substrate and the hot plate to prevent contamination on the central portion of the lower surface of the substrate.

According to some embodiments, a baking apparatus for priming a substrate is provided. The baking apparatus includes a chamber and a hot plate. The hot plate is in the chamber and in full contact with a lower surface of the substrate to prevent contamination on the lower surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A baking apparatus for priming a substrate, comprising:
   a chamber;
   a hot plate in the chamber, configured to bake the substrate on the hot plate; and
   a barrier element between the substrate and the hot plate, wherein the barrier element comprises a central portion and a peripheral portion laterally surrounding the central portion, and the central portion of the barrier element is not in contact with the substrate, and the peripheral portion of the barrier element is configured to be in contact with a side surface of the substrate and the hot plate, but not in contact with a lower surface of the substrate, so as to prevent contamination on the lower surface of the substrate, wherein the barrier element is made of polyimide or silicone.

2. The baking apparatus of claim 1, which is configured to form a hydrophobic material on an upper surface of the substrate.

3. The baking apparatus of claim 2, wherein the hydrophobic material is hexamethyldisilazane (HMDS).

4. The baking apparatus of claim 1, wherein the barrier element is in a form of a plate.

5. A baking apparatus for priming a substrate, the substrate having a side surface and a lower surface, the baking apparatus comprising:
   a chamber;
   a hot plate in the chamber, and configured to bake the substrate on the hot plate; and
   a barrier element between the substrate and the hot plate and configured to be in contact with the side surface of the substrate and the hot plate, but not in contact with the lower surface of the substrate, so as to prevent contamination on the lower surface of the substrate, wherein the barrier element is made of polyimide or silicone.

6. The baking apparatus of claim 5, which is configured to form a hydrophobic material on an upper surface of the substrate.

7. The baking apparatus of claim 6, wherein the hydrophobic material is hexamethyldisilazane (HMDS).

8. The baking apparatus of claim 5, wherein the hot plate comprises a plurality of gap pins configured to support the substrate.

9. The baking apparatus of claim 5, wherein the barrier element is in a form of a plate.

10. The baking apparatus of claim 9, wherein the barrier element comprises a plurality of holes, and the hot plate comprises a plurality of gap pins respectively inserted in the holes of the barrier element.

11. The baking apparatus of claim 1, wherein the central portion of the barrier element is in contact with the hot plate.

12. The baking apparatus of claim 1, wherein the hot plate comprises a plurality of gap pins configured to support the substrate.

13. The baking apparatus of claim 12, wherein the peripheral portion of the barrier element has a height greater than a height of each of the gap pins.

14. The baking apparatus of claim 12, wherein the barrier element comprises a plurality of holes, and the gap pins are respectively inserted in the holes of the barrier element.

15. The baking apparatus of claim 5, wherein the barrier element is in a form of a ring.

\* \* \* \* \*